United States Patent [19]
Haspeslagh et al.

[11] Patent Number: 5,325,399
[45] Date of Patent: Jun. 28, 1994

[54] DIGITAL SIGMA-DELTA MODULATOR AND ARITHMETIC OVERFLOW PROTECTED ADDER

[75] Inventors: Didier R. Haspeslagh, Harelbeke; Erik Moerman, Bottelare, both of Belgium

[73] Assignee: Alcatel, N.V., Amsterdam, Netherlands

[21] Appl. No.: 878,120

[22] Filed: May 5, 1992

[30] Foreign Application Priority Data

Jun. 28, 1991 [EP] European Pat. Off. ......... 91870103.8

[51] Int. Cl.[5] .............................................. H04B 14/06
[52] U.S. Cl. ........................................ 375/28; 341/143
[58] Field of Search ...................... 375/27, 28; 341/143

[56] References Cited

U.S. PATENT DOCUMENTS

| | | | |
|---|---|---|---|
| 4,202,011 | 5/1980 | Koga | 375/28 X |
| 4,528,551 | 7/1985 | Agrawal et al. | 375/27 X |
| 5,068,659 | 11/1991 | Sakaguchi | 375/28 X |

OTHER PUBLICATIONS

Boser et al., "The Design of Sigma-Delta Modulation Analog-to-Digital Converters," IEEE Journal of Solid-State Circuits, vol. 23, No. 6, Dec. 1988, pp. 1298-1308.
Everard, "A Single-Channel PCM Codec," IEEE Transactions on Communications, vol. COM-27, No. 2, Feb. 1979, pp. 283-295.
Agrawal et al., "Design Methodology for $\epsilon\Delta M$," IEEE Communications Society International Conference on Acoustics ..., Paris, France, May 1982, pp. 360-369.
Friedman et al., "A Dual-Channel Voice-Band PCM Codec Using $\epsilon\Delta$ Modulation Technique," IEEE Journal of Solid-State Circuits, vol. 24, No. 2, Apr. 1989, pp. 274-280.
Candy, "A Use of Double Integration in Sigma Delta Modulation," IEEE Transactions on Communications, vol. Com-33, No. 3, Mar. 1985, pp. 249-258.

Primary Examiner—Stephen Chin
Assistant Examiner—Tesfaldet Bocure
Attorney, Agent, or Firm—Spencer, Frank & Schneider

[57] ABSTRACT

In a digital sigma-delta modulator with multi-phase operations by time-sharing including an adder to produce multiple integration, an arrangement includes switching circuitry for alternately establishing one of: a connection between a first input of the adder and an input of the modulator; and connections between the adder output and the first input of the adder by way of a first integration delay circuit, and the adder output and a second input of the adder by way of a second delay circuit.

20 Claims, 1 Drawing Sheet

DIGITAL SIGMA-DELTA MODULATOR AND ARITHMETIC OVERFLOW PROTECTED ADDER

BACKGROUND OF THE INVENTION

1. Field of the Invention

The invention relates to a digital sigma-delta modulator with multi-phase operations by time-shared means including an adder to produce multiple integration.

2. Background Information

Such a second-order modulator based on a double-loop configuration but with the digital integrators implemented by add and store structures using a time-shared arithmetic unit having two phases of operation corresponding to the two integrations is outlined in the IEEE Journal of Solid-State Circuits, Vol. 24, No 2, April 1989, p. 274 to 280, particularly on p. 278, as part of a dual-channel voice-band PCM codec. The basic configuration shown differs from the classical double-loop circuit in that the output integrator has its delay circuit not in the forward path, immediately after the adder, but in the feedback loop as for the input integrator, a third delay circuit being added between the output integrator and the quantizer. In other words, one keeps a delay circuit in the forward path, but since it is shifted beyond the feedback loop, the latter also includes a delay circuit to keep the equivalence with the classical circuit. The latter is for instance discussed in the IEEE Transactions on Communications, Vol.COM-33, No 3, March 1985, p. 249 to 258, where the advantages of double integration in conjunction with two-level quantization are explored in relation to more general structures having three or more feedback loops and quantizers not limited to two levels only. In the first article mentioned above, the digital delay circuits are used as registers with the content of the first added to the digital input signal during a first phase of operation. The result is used to update this first register and it is added to the content of the second register. The quantization is achieved by taking the sign bit from the second register. The 1-bit subtraction of the quantizer bit is done by bit manipulation of the Most Significant Bit of the input signal for the first phase and of the input coming from the first register during phase two. Bit manipulations, by combinational logic techniques on the MSBs of the two numbers of which the difference is to be obtained without performing a full subtraction operation, is for instance disclosed in the U.S. Pat. No. 4209773 as well as in the IEEE Transactions on Communications, Vol.COM-27, No 2, February 1979, p. 283 to 295, particularly on p. 288 describing a single loop digital Delta Sigma Modulator part of a single-channel PCM codec. This uses 2's complement arithmetic with parallel bit operations as is also the case in the U.S. Pat. No. 4270027 on a telephone subscriber line unit with sigma-delta digital to analog converter where only an adder, without an additional subtractor, is disclosed, e.g. in FIG. 5 of that patent, for the single loop digital integration.

The solution of the first article using a time-shared arithmetic unit for a second-order Digital Sigma-Delta Modulator starting from a double-loop circuit configuration, with the input and output integrators each including registers providing feedback loop delays, implies two separate registers each with associated input and output switches enabling appropriate connections to the adder and to the digital sigma-delta modulator (hereafter referred to as DSDM) input during the two phases of operations. Especially when implementing such a time-shared solution in a dedicated structure not relying on a time-shared arithmetic unit used also for other purposes, it would be desirable to avoid three 2-way switches to interconnect the adder inputs and output with the two registers and with the DSDM input in the way appropriate to the two phases of operations. This is all the more true with a bit-slice architecture, e.g. with operations on 17 bits in parallel, if one wishes to minimize the area of the chip, e.g. CMOS. Likewise, savings with respect to the two separate registers solution would help to achieve that goal.

Instead of the modified architecture of the basic second-order double-loop DSDM, used in the first article for a time-shared approach, it is also known to have the delay circuit of the input integrator not in the feedback loop but in the forward path, immediately after the adder, as for the output integrator. This is disclosed for instance in the IEEE Transactions on Communications, Vol. COM-31, No 3, March 1983, p.360 to 369, as well as in the IEEE Journal of Solid-State Circuits, Vol. 23, No 6, December 1988, p. 1298 to 1308, particularly p.1300 discussing the extraction of this modified structure from the conventional one.

SUMMARY OF THE INVENTION

A general object of the invention is to realize a DSDM using time-shared means based on a digital integrator with a delay circuit included in the forward path after the adder.

In accordance with the main feature of the invention, the modulator includes switching means alternately establishing paths between on the one hand, an input of the adder and on the other hand the input of the modulator or, via respective delay circuits, both the output and the other input of the adder.

In this manner, the DSDM can perform two or more integrations for each digital input sample in a time division multiplex manner while avoiding a plurality of registers storing multibit words in parallel fashion, only clocked digital delay circuits being needed. Also, only a single 2-way multibit switch is needed.

Moreover, the time shared structure used is not only adapted to the realization of a multiplex DSDM, time-sharing being then also employed to deal with a plurality, e.g. 4, of independent pairs of inputs and outputs, but such a DSDM may also perform three or more integrations, the first one with the switching means coupled to the DSDM input and the others with a coupling to the delay circuits, there being two or more of these in cascade towards the other input of the adder.

As disclosed for instance in the first patent cited above, i.e. U.S. Pat. No. 4209773, the adder used in a DSDM can conveniently be a multibit adder/subtractor operating in two's complement code. The latter implies that all binary code values are restricted to a range including only the $2^{}m$ values from $-2^{}(m-1)$ to $2^{}(m-1)-1$ where m is the number of bits and that the negative of any value is its complement with respect to $2^{}m$, $$ being the exponent sign. It is obtained by taking the one's complement, i.e. inverting all m bits, and adding one to the result, positive and negative values having their Most Significant Bits, hereafter referred to as MSBs and acting as sign bit with negative instead of positive weight, equal to 0 and 1 respectively. Moreover, this restriction in the range of values is insufficient to prevent a so-called arithmetic overflow leading to an incorrect sum when the magnitude of the sum is at least equal to 2(m−1) which possibility may only arise when the two added values have the same sign but lead to a sum having the opposite and wrong one. This means that the adder input numbers should in fact additionally be restricted to a magnitude less than 2**(m−2) to avoid wrong sums following such an arithmetic overflow condition.

Another object of the invention is therefore to realize such a multibit adder producing acceptable sums without this additional restriction on the input values using a given number of bits.

In accordance with another feature of the invention, in a multibit adder for binary values in two's complement form and with an arithmetic overflow detector controlling an adder output logic circuit to produce a maximum range output signal when the sum would otherwise be out of range, the detector is characterized in being adapted to feed a positive or a negative overflow signal to the logic circuit when the Most Significant Bit MSB of the adder output signal fed to the logic circuit and to the detector differs from both MSBs of the two adder input signals also fed to the detector, whereby for such overflow conditions the logic circuit modifies the adder output signal to produce a logic circuit output signal with a MSB differing from all other bits.

In the known arithmetic overflow protected adder disclosed in the above U.S. Pat. No. 4209773, e.g. in FIG. 2 thereof, this feature is not used when adding two arbitrary values but when one of these is an offset signal having a predetermined sign and magnitude for instance 0001 for its four MSBs, so that it is a positive value equal to one eighth of the largest magnitude of the input signal. When the latter has its four MSBs given by 0111, the addition of these two positive values would give 1000, a wrong negative one, and the detector then prevents the addition of the offset signal, normally used to shift the quantization noise spectrum of the DSDM output. Instead, the detector forces all Least Significant Bits LSBs of the output signal to 1, using OR gates, so that this signal becomes 01111 . . . 1, the maximum positive range.

On the other hand, the above feature is a general yet simple one for adding any two values. With the logic circuit based on two cascaded NOR gates it is sufficient to exchange the positive or negative overflow signals provided by the detector when dealing with other bits than the MSB of the output signal, e.g. in a parallel multibit adder the connections from the detector should be crossed towards the logic circuit for the MSB as opposed to the logic circuits for the LSBs.

BRIEF DESCRIPTION OF THE DRAWINGS

The above mentioned and other objects and features of the invention will become more apparent and the invention itself will be best understood by referring to the following description of an embodiment taken in conjunction with the accompanying drawings which block diagrams represent.

DETAILED DESCRIPTION OF THE PREFERRED EMBODIMENTS

Figure 1:
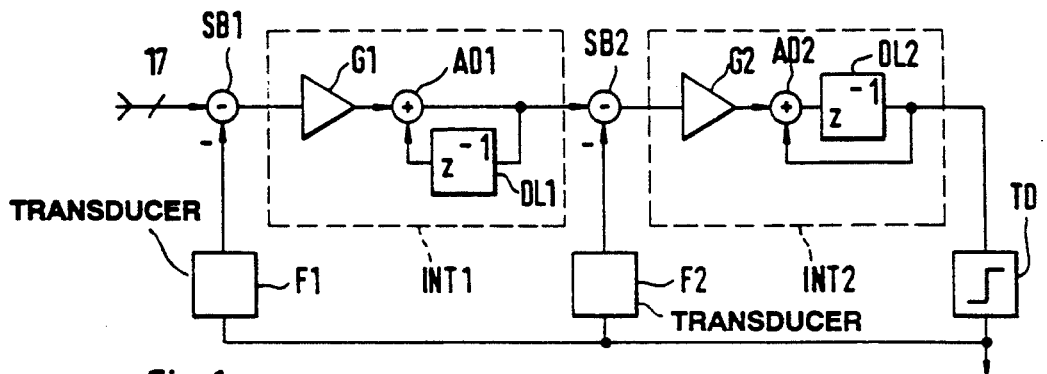
FIG. 1, a general second-order DSDM with inner and outer feedback loops.

FIG. 1 shows a second-order digital sigma-delta modulator DSDM with a slash marked 17 across its input to indicate that it is adapted to the parallel processing of 17-bit input words, each of the 17 bits generally passing through the input integrator INT1 and the output integrator INT2 to reach the output through a threshold detector TD delivering a one-bit output which is also fed back to the subtractors SB1 and SB2, through respective transducers F1 and F2, at the inputs of INT1 and INT2 respectively. Therein, the words pass through respective transducers G1 and G2 to reach the respective adders AD1 and AD2, parts of the integrators INT1 and INT2, and with the outputs of the adders fed back to their other inputs through respective delay circuits DL1 and DL2 both producing a one-word delay as indicated by $z^{}-1$, where  is the exponent sign. Whereas DL1 is shown in the internal feedback loop of INT1, DL2 is in the forward path of INT2 but as initially outlined, in opposition to the conventional form shown in FIG. 1, in the modified architecture, DL1 can be in the forward path as is DL2.

Various overall transfer responses for the general circuit of FIG. 1 can be considered in terms of the z-transform output to input transfer function. Starting first with the transfer function of the integrators, that (INT2) corresponding with the delay circuit (DL2) in the forward path, immediately after the adder (AD2), is for instance given as $g(z-k)^{}-1$ in the fifth (1988) article referred to previously. This includes a gain (G2) parameter g as well as a leakage parameter k taking into account the possibility of integrator leak so that the DC gain (z=1) is no longer infinite (k=1), the above expression then becoming $g(1-k)^{}-1$.

If on the other hand, the delay circuit (DL1) is in the feedback loop of the integrator (INT1), the generalized response becomes $gz(z-k)^{}-1$, this multiplication by z co-responding to the delay $z^{}-1$ being no longer in the forward path.

With such possible values for the integrator transfer function, various overall transfer functions for the general circuit of FIG. 1 can now be considered. Starting with DL1 and DL2 as represented, the z-transform output to input response T(z) can be shown to be $$T(z) = \frac{z}{D(z)} \quad (1)$$

with D(z) defined by $$g1g2D(z) = z^{**}2 - (k1+k2-f1g1g2-f2g2)z + k1(k2-f2g2) \quad (2)$$

wherein f1, f2, g1, g2 are the respective gains of F1, F2, G1, G2 and k1, k2 the leakage factors of INT1, INT2 through their feedback loops.

If DL1 is now in the forward path like DL2, (1) becomes $$T(z) = \frac{1}{D(z) + f1(1-z)} \quad (3)$$

while keeping the circuit of FIG. 1 but introducing a z−1 delay in F1, between the output and the input of the modulator, changes (1) into $$T(z) = \frac{z}{D(z) + f1(1-z)} \qquad (4)$$

this multiplication of (3) by z to reach (4) again corresponding to a delay $z^{}-1$ being no longer in the forward path just as z disappears from the numerator in passing from (1) to (3). This is explained by noting that with a delay $z^{}-1$ (not shown) preceding the DSDM of FIG. 1, with a like delay in F1 and with DL1 in the feedback loop as shown, these three $z^{**}-1$ delays are equivalent to a single one in the forward loop of INT1.

Considering (1) and (3) with D(z) as defined by (2), one can verify the previously mentioned relation between the circuits with DL1 in the feedback or in the forward path under the conditions given in the fifth (1988) article referred to above. In view of the $z^{}-1$ delay difference between the two cases, naturally (1) and (3) cannot become fully equivalent but for instance, they can become equal to $z^{}-1$ and $z^{}-2$ respectively, when the denominators of both (1) and (3) are reduced to $z^{}-2$ which imposes in the case of FIG. 1

$$k1 = f1g1g2 \qquad (5)$$

$$k2 = f2g2 \qquad (6)$$

and with DL1 as well as DL2 in the forward path $$k1^{**}2 = f1g1g2 \qquad (5')$$

$$k1+k2 = f2g2 \qquad (6')$$

Thus, (5) and (6) are for instance satisfied with all involved parameters substantially equal to unity whereas this will be true for (5') and (6') with the exception of g1=0.5 and g2=2. But as noted in the fifth (1988) article referred to above, in view of the TD quantizer g2 can in fact also be equal to 0.5, without impairing the performance of the modulator.

With both DL1 and DL2 in the forward paths of the integrators the fourth (1983) article mentioned above discloses a particular response corresponding to the denominator of (3) not being equal to merely $z^{}2$ but to $z^{}2-z+0.5$ whose poles are within the unit circle. As can be verified from (2), this corresponds to all parameters being unity except this time that f1=0.5.

As already noted for the circuit of the first (1989) article mentioned above, INT2 can be identical to INT1, instead of the representation of FIG. 1, provided the input of TD is now connected to the output of AD2 through a third $z^{**}-1$ delay circuit (not shown), the latter together with DL2 now in the feedback loop of INT2 being equivalent to DL2 as shown, so that the response is still defined by (1).

In relation to FIG. 2, which will be described further below, it is the response of (3) which will be used, for the circuit as shown, i.e. corresponding to DL1, in FIG. 1 being in the forward path as DL2, and moreover with z−1 delays effectively in both forward integration paths, and moreover with F1 producing a 0.5 gain whereas f2=g1=g2=1 so that the denominator of (3) is given by $z^{**}2-z+0.5$ which is the above preferred response. In view of the above noted equivalence, one can also remark that when there is an additional 0.5 gain before the input of the DSDM, this preferred response remains exactly the same if such a 0.5 gain before the input and in F1 are replaced by unity gains, i.e. no attenuation preceding the DSDM, and by G1 now providing a 0.5 gain whereas f1=f2=g2=1.

Figure 2:
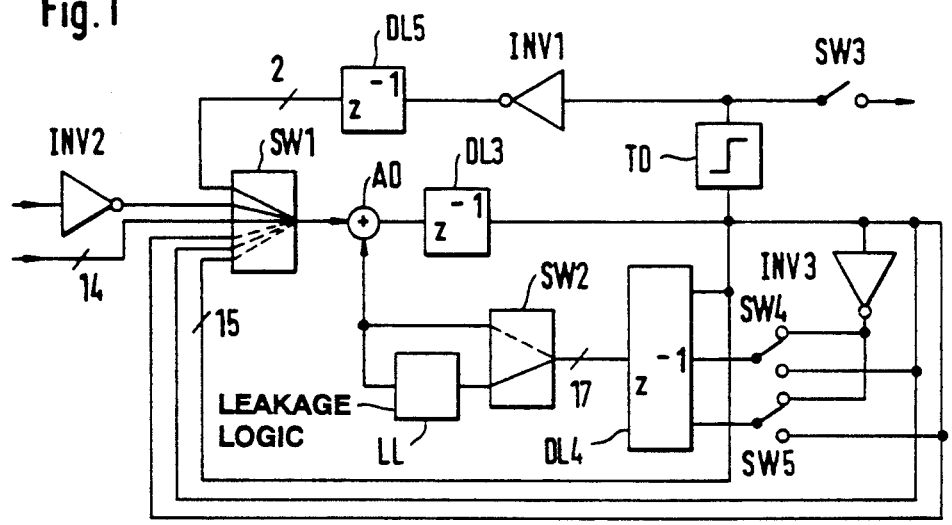
FIG. 2, an embodiment of a second-order DSDM in accordance with the invention.

FIG. 2 shows a DSDM including a basic digital integrator structure to be used repeatedly in multi-phase operations and formed by the adder AD output directly feeding DL3 which provides in the forward loop the $z^{**}-1$ delay for both integrations. But with these now being carried out in Time Division Multiplex fashion using the single adder AD instead of AD1 and AD2 in FIG. 1. As will be stressed below care is needed in comparing these interleaved input and output integrations with those of FIG. 1 and their associated responses such as defined by (1) and (3).

The integrator feedback loop now includes two main parallel paths from the output of DL3, the first through multiplexer 2-way switch SW1, i.e. with 3 sets of terminals, to one input of the adder AD, and the second through delay circuit DL4 to the other input of AD. Just as the $z^{**}-1$ delay circuit DL3, DL4 has access to its input and output controlled by a master clock (not shown). With DL3 and DL4 in cascade, one can now have two successive DL3 output words simultaneously available, albeit with modifications as will be detailed below, one at its input and the other (modified) at its output so that they can be added to one another by AD. This will occur only during what will be called the even cycles of the square pulse clock when SW1, operated at half the clock frequency, is in the interrupted line condition, whereas during the odd cycles SW1 connects AD to the DSDM input, the SW1 period thus corresponding to a sample period.

The second parallel feedback path also extends through a further multiplexer 2-way switch SW2, i.e. with 3 sets of terminals, as well as through a leakage logic circuit LL at one of the SW2 outputs, but these elements between DL4 and AD, whose function will be described later, are not essential to the basic operation for which one may consider a direct link between DL4 and AD. Switch SW1, on the other hand, has an essential function with one of its two inputs constituting the DSDM input. The output of the DSDM is obtained from the threshold detector or quantizer TD, connected at the output of DL3, but through a buffer switch SW3.

Contrary to this last switch having only to pass one (output) bit, SW1, as well as SW2, must deal with all the bits in parallel. But FIG. 2 shows that, considering 17 bits as in FIG. 1, some of these are handled in a distinct way, particularly some of the Most Significant Bits, in order to provide the effect of such subtractors as SB1 and SB2 of FIG. 1 and which are not present in FIG. 2 where the single adder AD can now take care of implementing multiple order DSDMs such as that of FIG. 1 using two distinct integrators (INT1 and 2) in cascade.

Considering the first integrator INT1 of FIG. 1, if its preceding subtractor SB1 is to be integrated with AD1, some MSBs of the input signal must be adapted in a manner similar to that disclosed in the first U.S. Pat. No. 4209773 and the third article (1979) referred to previously. Therein, with input signals of m bits, using two's complement representation as discussed above, the adder is fed by the m−1 Least Significant Bits of the input signal, by a higher ranked bit corresponding to the inverse of the input signal MSB and by an (m+1)th MSB for the adder input equal to the inverse of the DSDM quantized output bit.

FIG. 2 shows a similar arrangement except that, as shown by the correspondingly numbered slash, the two MSBs fed back to AD through SW1, in the condition indicated by the continuous lines inside the representation of this 2-way multiplexer switch, are this time equal to the inverse of the output bit provided by TD. As shown, this is returned to SW1 through a third, auxiliary, parallel feedback path including inverter INV1 and delay circuit DL5 outputting two like bits towards SW1 as indicated by the slash marked with 2.

The reason why the two MSBs are now the inverse of the output bit is explained when considering the possible values for the 3 MSBs associated with SB1 in FIG. 1, the LSBs of the input being unaffected by those from the F1 output:

| Input | 000 | 000 | 111 | 111 |
|---|---|---|---|---|
| - F1 output | 111 | 001 | 111 | 011 |
| SB1 output | 111 | 001 | 110 | 000 |

There are only 2 possible values both for the input of the DSDM and for the F1 output. Starting with the latter under the previous assumption that F1 gives a scalar gain of 0.5 equivalent to a shift of one bit to the right, with all codes expressed in two's complement notation, there are only 001 or 111 as possible values for the 3 MSBs produced by F1. Indeed, the last bit on the right is always 1, corresponding to the magnitude of the subtracted output signal having 0 for all its LSBs while the first two bits are both 0 or both 1, depending on the sign, in view of the shift of one bit leading to a sign extension. For the input there are also only 2 possible values, i.e. 000 or 111, for the 3 MSBs and corresponding only to the sign, i.e. 0 for a positive value and 1 for a negative one, all the LSBs being arbitrary. This implies therefore a double sign extension equivalent to a 0.25 scalar gain. A first 0.5 factor can be explained by loop stability reasons. Indeed, if the DSDM is preceded by a 0.5 scalar gain, considering the latter with F1 producing a like gain is equivalent, as noted above, to G1 in FIG. 1 affording such a 0.5 gain, while f1=1 and the 0.5 gain in front of the DSDM is also removed. This means that the input integrator INT1 now has a scalar gain of 0.5 as disclosed in the fifth (1988) article previously cited, i.e. well below unity and ensuring stability. The other 0.5 factor producing the overall gain of 0.25 for the input signal must be obtained on the other hand before the DSDM and this deliberate limitation of the input signal range avoids a sharp drop in the signal to noise ratio as disclosed in the fourth (1983) article cited above.

Thus, the above table gives the 4 possible results for the three MSBs at the output of SB1 in FIG. 1, with the two MSBs always the same, the LSBs remaining those of the input since the corresponding ones at the F1 output are all zeroes. While the two MSBs are the inverse of the DSDM single output bit provided through INV1 and DL5 in FIG. 1, the third MSB is the inverse of the input bit of like rank and is shown to be provided by inverter INV2, the remaining 14 bits, as noted by the slash, being the original input bits.

During the time the circuit of FIG. 2 performs the integration operation corresponding to that of INT1 and SB1 in FIG. 1, the interrupted lines in SW1 indicate that the 15+2=17 bits at the output of DL3 have, of course, no effect on this 2-way multiplexer switch but the 16 LSBs are instead active at the input of the additional delay DL4, the 15 LSBs directly and the second MSB through INV3 and switches SW4 and 5, being used in inverse form for the two MSBs at the input of DL4.

This corresponds to the output integrator INT2 of FIG. 1 when incorporating the action of subtractor SB2. In this case, the functions of the latter and of AD2 are merged in FIG. 2 by considering this time the output of DL2 in FIG. 1 together with that of TD applied through F2. Since the latter is assumed to have unitary gain, contrary to 0.5 for F1, only the two MSBs of the signal to be subtracted need be considered, all LSBs being zeroes without any effect on the bits of corresponding rank at the output of DL2. Hence, one has again a table of 4 possibilities, i.e.

| Output | 00 | 11 | 01 | 10 |
|---|---|---|---|---|
| -F2 output | 11 | 01 | 11 | 01 |
| SB2 output | 11 | 00 | 00 | 11 | but giving this time only 2 possible results. Indeed, the two MSBs of the output give 4 possibilities but with the MSB being the sign of the output, the subtracted MSB of the F2 output is always its inverse while the second MSB is always 1. As a result, the two MSBs of the effective SB2 output can only be 11 or 00, as indicated by the table, i.e. the inverse of the second MSB of the output which is the highest after the sign, determining the subtracted value. This justifies the manner in which the 16 LSBs at the output of DL3 produce the 17 bits applied to DL4 with SW4 and 5 in the positions shown.

In this manner, a second or output integration can be performed using the DL4 value by changing the position of the 2-way multiplexer switch SW1 as well as those of the single bit SW3, 4 and 5 switches.

During the time the switches does not occupy the position shown on FIG. 2, the second or output integration can be performed by AD being this time fed by the 17 bits supplied in parallel by DL3 through SW1 in the interrupted lines position, the other AD input receiving the DL4 signals. During such periods, the input is this time isolated whereas closure of SW3 delivers the single bit DSDM output signal.

Calling these the even periods, the odd ones having the switches, and particularly SW1, in the positions shown, the interleaving in FIG. 2 of the two integrations performed in space division in FIG. 1 will now be examined. For the latter calling I the words at the input of DSDM, A those at the input of INT1 and S those coming from the DSDM output for subtraction, the sequence of words for INT1 as it is shown is defined by $$Ai = A(i-1) + Ii - Si \qquad (7)$$

where i defines the values in a particular clock cycle so that $Ai - 1$ represents the corresponding A word immediately preceding $Ai$ and now at the output of DL1 in the feedback loop of INT1. On the other hand, replacing respectively A by B and I by A for the corresponding relation covering INT2, one has in the same i clock cycle $$Bi+1 = Bi + Ai - Si \qquad (8)$$

since DL2 is in the forward path of INT2.

Such a clock cycle shift for some of the values, e.g. with respect to Si, between (7) and (8) naturally disappears when both INT1 and INT2 have their respective delays DL1 and DL2 in the same position and particularly in the forward path as now considered in FIG. 2 so that the input integration sequence would then correspond to that of the output i.e.

$$A(i+1) = Ai + Ii - Si \qquad (7')$$

With the interleaved A and B operations of FIG. 2 however, the sequence of alternate A and B words at the output of AD are to be found in identical form at the output of DL3 one clock period later and after yet a further clock period at the output of DL4 with B modified into B' to take into account, as explained above, the incorporation of the subtractor SB2 (FIG. 1) into the process. This means that such values can be tabulated as follows for three consecutive clock periods:

| SW1 | AD | DL3 | DL4 | TD | DL5 |
|---|---|---|---|---|---|
| — | — | — | — | — | — |
| I'i-1 | Ai | Bi | Ai-1 | — | Si-1 |
| Ai | Bi+1 | Ai | B'i | Si | — |
| I'i | Ai+1 | Bi+1 | Ai | — | Si |

The six columns correspond to the outputs of SW1, AD, DL3, DL4, TD and DL5 respectively and the phasing of these outputs corresponds to (7') and (8). Hence, during the odd clock cycles the input word I can reach the output of SW1 in the position shown and modified into I' to take into account, as also explained above, the incorporation of the subtractor SB1 (FIG. 1) into the process. Since (7') indicates that such an I' word is added to a like ranked A word, one must have in the DL4 column Ai−1 in the first row corresponding to I'i−1, and Ai in the third row to be added to I'i. During the even clock cycles on the other hand, Ai appears in both the SW1 and DL3 columns and (8) indicates it must be added to the like ranked B word, i.e. D'i. The preceding considerations thus lead to the 12 indicated words occupying the positions shown for the first 4 columns.

Now considering the 5 and 6th columns giving the sign at the output of TD and DL5, it is important to recall that in FIG. 1, Ai is obtained from Ii and Bi from Ai both involving the subtraction of the same Si sign value, the latter obtained from Bi. But in FIG. 2, due to these operations occurring in distinct clock cycles in view of the interleaved processes, the first row of the above table indicates that to produce I'i−1 at the output of SW1 from Ii−1 at its input one needs Si−1 in view of (7') whereas it is Bi which is already at the output of DL3 instead of Bi−1. Hence, in order to have Si−1 available as required by (7'), the output of DL3 is coupled to the input of SW1 through TD and DL5 in cascade, each clocked so as to ensure a delay of one clock interval.

Therefore, to Bi in the first row corresponds Si in the second row in the TD column and in the third row in the DL5 column with Si−1 in the first row in the DL5 column, as required by (7'). In the second row, Si obtained from Bi having operated upon the latter through INV3, SW4 and 5, B'i has appeared at the output of DL4, as required by (8).

Thus, the above table based on the two iterative relations (7') and (8) indicates that FIG. 2 can produce responses of the type defined by (3) and particularly, one with a T(z) denominator equal to $z^{**}2 - z + 0.5$. But although DL3 is positioned in the forward path, between AD and TD, simple modifications of FIG. 2 consisting in removing DL5, and directly connecting INV1 to SW1 (not shown), as well as shifting the operation of SW3 by one clock cycle to output Si, enable operations based this time on the two iterative relations (7) and (8), i.e. responses of the type defined by (1).

Indeed, with Si now appearing in the TD column of the above table in the first row, and consequently Si+1 in the third row, the modified FIG. 2 can now operate in accordance with (7) since the first row of the table can correspond to that iterative relation if the first column (output of SW1) now includes I'i instead of I'i−1 as indicated above. Such a shift of a sampling period or two clock intervals and naturally bringing also I'i+1 in the third row instead of I'i corresponds to a delay before the DSDM input and hence of no effect on its operations. As previously, the second row corresponds to (8) and accordingly, instead of the second and third rows defining responses of the type expressed by (3), the first and second rows now show that, as modified above, FIG. 2 works in accordance with (1). Naturally, whether the general response is defined by (1) or (3), the various parameters such as f1 and f2 can still be chosen to produce a specific response, i.e. a particular function of z for the denominator of T(z). For instance, (2) shows that with g1, g2, k1 and k2 all equal to unity, f1=f2=0.5 will now lead to D(z), the denominator of (1), being equal to the above preferred function $z^{**}2 - z + 0.5$. Since f2 was unity for FIG. 2 as shown, evidently this will entail modified bit manipulations to cater for the suppression of SB2 in FIG. 1 so that the elimination of DL5 may on the other hand lead to less simple circuitry to obtain B'i.

Although the embodiment of FIG. 2 has been described as a time-shared equivalent of the second-order DSDM of FIG. 1, the basic operations can be retained with some adaptations both for a higher order DSDM and for a multiplex DSDM operating also in time-sharing for two or more independent sources and loads. In the case of a DSDM of the n th order it will in particular be necessary that SW1 should no longer be operated by a square wave at half the clock frequency but SW1 will only be in the position shown for 1 out of n successive clock periods while the DL4 circuit additional to the $z^{**} - 1$ delay (DL3) will be constituted by a cascade of n−1 delay circuits or shift registers. Since the sign will now be available only during 1/n th of the time, a latch will be needed to keep it available for the n integrations. If m second-order DSDMs are now time multiplexed, the distinct DSDM inputs should be gated into SW1 also during 1 out of m successive periods for each of which SW1 would occupy its two positions during half the period. Likewise, DL4 should then include 2m−1 cascaded delay circuits.

Moreover, the two extensions could also be envisaged with the sampling period divided into m n clock periods and DL4 then including a cascade of mn−1 delay circuits.

Additional features can also be incorporated into the time-shared design of FIG. 2 such as the leakage logic circuit LL associated with the multiplex switch SW2 between DL4 and AD instead of the direct coupling assumed so far. This technique has been disclosed in the U.S. Pat. No. 4733219 and enables the reduction of unwanted low frequency components, when the input signal becomes equal to zero, using an additional feedback loop in the input integrator.

Contrary to such loops as that involving F1 and DL1 in FIG. 1 and which can be combined as explained previously, this is not possible for the LL loop of FIG. 2 since the latter involves the LSBs and not the MSBs of the words with the former inevitably leading to a carry propagation problem. Thus, FIG. 2 shows that for the input integration with both 2-way switches SW1 and SW2 in the positions corresponding to uninterrupted lines, the DL4 feedback loop includes LL, the circuit of the U.S. patent last mentioned, whereas SW1 and SW2 in their other positions (interrupted lines) allow an output integration without leakage.

Another supplementary feature which can be incorporated into the circuit of FIG. 2 is overflow detection and correction for the time-shared adder AD, particularly for a higher order DSDM. As mentioned in the fourth article (1983) referred to above, already a second-order DSDM can enter an overload region and exhibit a wild oscillatory behavior if the adders are allowed to overflow.

Figure 3:
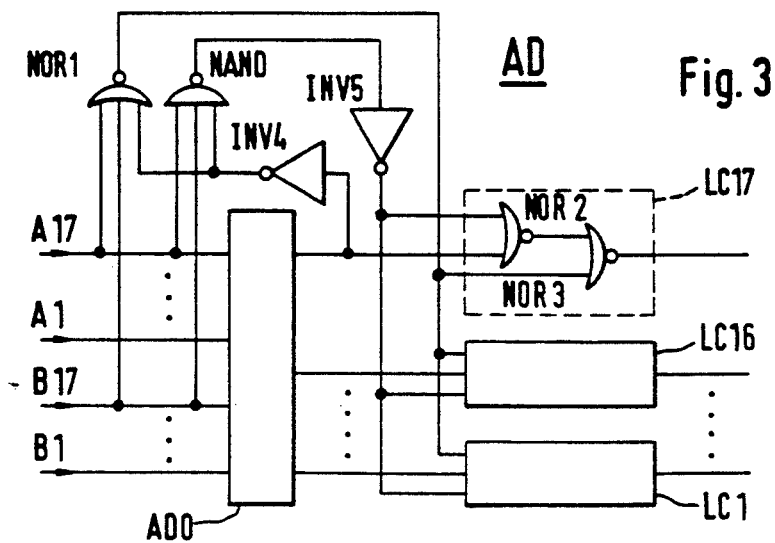
FIG. 3, an embodiment of an arithmetic overflow protected parallel multibit adder using two's complement values in accordance with the invention.

FIG. 3 shows how the adder AD of FIG. 2 can be realized so as to detect arithmetic overflow and use flat clipping to limit the output values to the maximum positive or negative one when the sum would otherwise go out of range. As recalled previously, using the two's complement representation to replace all subtractions by additions implies that the m-bit values, with a MSB equal to 0 or 1 depending on it being positive or negative respectively, cannot be more negative than $-2^{}(m-1)$ or more positive than $2^{}(m-1)-1$, the two's complement of any value with respect to $2^{**}m$, e.g. to subtract a positive one, being obtained by adding 1 after inversion of all bits. With m=3 for instance, the following table gives all allowed values with their two's complement as 3-bit codes:

| | Code | 2's complement | |
|---|---|---|---|
| 3 | 011 | + 101 | = (1)000 |
| 2 | 010 | + 110 | = (1)000 |
| 1 | 000 | + 111 | = (1)000 |
| 0 | 000 | + (1)000 | = (1)000 | and one notes that the complementary code for a (positive) 0 is the original code 000, the 4 th bit carry being disregarded, just as the most negative value −4, i.e. the negative 0, has also its own code 100 as complement.

Adding two numbers of opposite signs cannot produce an out-of-range value for the sum but there is a possibility of a wrong result with the wrong sign when the signs of the two added numbers are the same, e.g. −2−3 giving 110+101=(1)011 or 3 instead of −5.

FIG. 3 avoids such errors generally giving a wrong sum with a shift of $2^{**}m$, e.g. 8=3−(−5), by detecting a wrong sign for the sum and by forcing a sum with the right sign and with the largest magnitude. This flat clipping substantially reduces the above errors and can be achieved with limited additional means even for a multibit parallel adder. As shown, the basic adder ADO, with inputs A1 ... A17, and B1 ... B17 to add two 17-bit numbers, is provided with an arithmetic overflow detector comprising the NOR1 and NAND gates and the inverters INV4 and 5. Both A17 and B17, the MSBs or sign bits of the input numbers, are inputs for each of the gates which are additionally fed by INV4 providing the inverse of the ADO sum MSB. Hence, NAND, through its output inverter INV5, and NOR1 will provide negative and positive overflow signals respectively. The negative overflow signal from INV5, i.e. when both A17 and B17 being 1, the MSB of the sum is nevertheless a wrong 0, will cause NOR2 gate at the input of the logic circuit LC17 to give a 0 input to NOR3 at the output of LC17 and since NOR1 also outputs 0, the MSB output of ADO also feeding NOR2 in LC17 will give a corrected MSB equal to 1 thereby correctly indicating a negative sum. As shown, the outputs of NOR1 and INV5 are crossed for driving remaining logic circuits LC1 to LC16, all identical to LC17, with the result that each of these will output a 0, i.e. the sum becomes the most negative value 100 ... 0, since 1 from INV5 is now applied to NOR3 in LC1 to 16 forcing a 0 output. On the other hand, a positive overflow signal from NOR1 will force a 0 at the output of LC17 to indicate correctly a positive sum. In LC1 to 16, this 1 from NOR1 will force NOR2 to output a 0 and since INV5 also gives a 0, NOR3 will output a 1 whereby the sum is now the most positive value 011 ... 1. If neither INV5 nor NOR1 outputs a 1, indicating there is no overflow condition, NOR2 and 3 in all LC circuits will only be influenced by their respective inputs from ADO which will be outputted in unmodified form after a double inversion through NOR2 and 3 in cascade.

While the principles of the invention have been described above in connection with specific apparatus, it is to be clearly understood that this description is made only by way of example and not as a limitation on the scope of the invention.

We claim:

1. In a digital sigma-delta modulator with multi-phase operations by time-shared means including an adder to produce multiple integration, an arrangement comprising:

switching means for alternately establishing one of:
a connection between a first input of the adder and an input of the modulator; and
connections between the adder output and the first input of the adder by way of a first integration delay circuit, and the adder output and a second input of the adder by way of a second delay circuit.

2. The digital sigma-delta modulator arrangement as in claim 1, wherein the switching means is coupled to the input of the modulator during a first integration and to both the first and second delay circuits during subsequent integrations.

3. The digital sigma-delta modulator arrangement as in claim 1, wherein at least one of the adder inputs is fed through at least two delay circuits in cascade.

4. The digital sigma-delta modulator arrangement as in claim 3, wherein the first delay circuit is disposed nearest the adder output and feeds the adder input not fed through the at least two delay circuits in cascade.

5. The digital sigma-delta modulator arrangement as in claim 4, wherein the first delay circuit disposed nearest the adder output feeds the other adder input through the switching means.

6. The digital sigma-delta modulator arrangement as in claim 4, wherein the first delay circuit disposed nearest the adder output feeds a modulator quantizer.

7. The digital sigma-delta modulator arrangement as in claim 6, wherein the modulator quantizer is coupled to an output of the modulator through output switching means.

8. The digital sigma-delta modulator arrangement as in claim 7, wherein the modulator quantizer provides a one bit output signal.

9. The digital sigma-delta modulator arrangement as in claim 6, wherein a third delay circuit couples an output of the modulator quantizer to the first adder input through the switching means during the first integration.

10. The digital sigma-delta modulator arrangement as in claim 9, wherein the third delay circuit produces a delay corresponding to a clock period of the modulator.

11. The digital sigma-delta modulator arrangement as in claim 6, wherein the modulator quantizer produces a delay corresponding to a clock period of the modulator.

12. The digital sigma-delta modulator arrangement as in claim 3, wherein the number of cascaded delay circuits is equal to mn where m is a positive integer representing the number of independent input/output pairs sharing the modulator in time division multiplex fashion and n is a positive integer larger than unity representing the number of integrations.

13. The digital sigma-delta modulator arrangement as in claim 12, wherein each of the cascaded delay circuits provides a delay which corresponds to a clock period of the modulator and that a modulator sampling period is equal to mn clock periods.

14. The digital sigma-delta modulator arrangement as in claim 1, wherein said adder is a multibit parallel adder for adding signals.

15. The digital sigma-delta modulator arrangement as in claim 14, wherein all multibit adder signals are in two's complement form.

16. The digital sigma-delta modulator arrangement as in claim 1,
wherein the switching means is coupled to the input of the modulator during a first integration and to both delay circuits during subsequent integrations,
wherein one of the adder inputs is fed through at least two delay circuits in cascade, and
wherein during the last of said subsequent integrations, switching means feed the inverse of the second most significant bit of a signal at the output of the delay circuit nearest the adder output, to the delay circuit feeding the other input of the adder, to act as the most significant bits of the signal.

17. The digital sigma-delta modulator arrangement as in claim 16, wherein during the first integration, the inverse of the quantizer bit replaces at least the most significant bit of the adder input prior to actually feeding the switching means.

18. The digital sigma-delta modulator arrangement as in claim 1, wherein the second delay circuit is coupled indirectly to the second adder input during the first integration via said switching means and a leakage logic circuit in a first condition and directly to the adder through said switching means in a second condition.

19. The digital sigma-delta modulator arrangement as in claim 1, wherein said adder comprises:

a multibit adder for binary values in two's complement form having an arithmetic overflow detector controlling an adder output logic circuit to produce a maximum range output signal when the sum would otherwise be out of range,
wherein the detector feeds a positive or a negative overflow signal to the logic circuit when the most significant bit of the adder output signal differs from both the most significant bits of the two adder input signals also fed to the detector, whereby for such overflow conditions the logic circuit modifies the adder output signal to produce a logic circuit output signal with a most significant bit differing from all other bits.

20. A digital sigma-delta modulator comprising:
adder means having at least first and second inputs and an output;
integration delay means, operatively coupled with the adder means, for delaying the output of the adder;
second delay means, operatively coupled with the integration delay means, for providing a second delayed output;
first switching means, operatively coupled with the second delay means, for selectively providing the output from the second delay means one of directly and through a leakage logic circuit, to the second input of the adder means;
modulator quantizer means, operatively coupled with the integration delay means, for receiving an output from the integration delay means and providing the modulator output through an output buffer switch;
first inverter means, operatively coupled with the modulator quantizer means, for receiving an output from the modulator quantizer means and providing a first inverted output;
third delay means, operatively coupled with the first inverter means, for providing a third delayed output;
input switching means, operatively coupled with the first input of the adder means, the integration delay means, the third delay means, and the input of the modulator, for selectively providing input to the first input of the adder, the input of the modulator being provided by input lines including second inverting means, for inverting at least a most significant bit of the modulator input and providing the inverted bit to the input switching means; and
third inverting means, operatively coupled with the integration delay means and the second delay means, for selectively providing an inverted output to the second delay means of an output from the integration delay means.

* * * * *